(12) United States Patent
Sakurai et al.

(10) Patent No.: US 6,748,865 B2
(45) Date of Patent: Jun. 15, 2004

(54) NANO-IMPRINTING METHOD, MAGNETIC PRINTING METHOD AND RECORDING MEDIUM

(75) Inventors: Masatoshi Sakurai, Tokyo (JP); Katsuyuki Naito, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/301,606

(22) Filed: Nov. 22, 2002

(65) Prior Publication Data

US 2003/0127007 A1 Jul. 10, 2003

(30) Foreign Application Priority Data

Nov. 22, 2001  (JP) ......................... 2001-358062

(51) Int. Cl.$^7$ ............... B41C 5/00; B41M 5/00
(52) U.S. Cl. .................... 101/483; 101/463.1; 264/132
(58) Field of Search ................. 101/483, 489, 101/3.1, 32, 463.1; 250/492.22; 264/132; 428/310, 406; 369/283, 286

(56) References Cited

U.S. PATENT DOCUMENTS

| | | | |
|---|---|---|---|
| 4,095,008 A | * 6/1978 | Sundstrom et al. | 428/215 |
| 5,138,687 A | * 8/1992 | Horie et al. | 388/129 |
| 6,165,911 A | * 12/2000 | Calveley | 438/754 |
| 6,294,450 B1 | * 9/2001 | Chen et al. | 438/597 |
| 6,587,408 B1 | * 7/2003 | Jacobson et al. | 427/458 |
| 2002/0196729 A1 | * 12/2002 | Fairman et al. | 369/275.4 |
| 2003/0102444 A1 | * 6/2003 | Deppart et al. | 250/492.22 |

OTHER PUBLICATIONS

W. Wu, et al., J. Vac. Sci. Technol. B., vol. 16, No. 6, pp. 3825–3829, "Large Area High Density Quantized Magnetic Disks Fabricated Using Nanoimprint Lithography", Nov./Dec. 1998.

T. Ishida, et al., IEEE Transactions on Magnetics, vol. 37, No. 4, pp. 1875–1877, "Printed Media Technology for an Effective and Inexpensive Servo Track Writing of HDDs", Jul. 2001.

K. Naito, et al., Abstract of Intermag, 1 page, "2.5–Inch Disk Patterned Media Prepared by an Artificially Assisted Self-Assembling Method", 2002.

* cited by examiner

*Primary Examiner*—Eugene H. Eickholt
(74) *Attorney, Agent, or Firm*—Oblon, Spivak, McClelland, Maier & Neustadt, P.C.

(57) ABSTRACT

A nano-imprinting method includes a process of transferring an embossed pattern from a master plate (120) to a surface of a pattern-receiving or donee substrate (130) by applying a pressure to the master plate (120) having an information carrier region (120A) having formed the embossed pattern and the donee substrate (139) from opposite sides of a pair of press surfaces (100) sandwiching them. When the pressure is applied, a buffer layer (110) shaped in accordance with the information carrier region is interposed in a position aligned with a pattern-forming region between the master plate or donee substrate and the press surface.

9 Claims, 10 Drawing Sheets

NANO-IMPRINTING METHOD, MAGNETIC PRINTING METHOD AND RECORDING MEDIUM

CROSS-REFERENCE TO RELATED APPLICATIONS

This application is based upon and claims the benefit of priority from the prior Japanese Patent Application No. 2001-358062, filed on Nov. 22, 2001; the entire contents of which are incorporated herein by reference.

BACKGROUND OF THE INVENTION

This invention relates to a nano-imprinting method, magnetic printing method and recording medium. More particularly, the invention relates to a nano-imprinting method or a magnetic printing method including a novel technique for imprinting a physically embossed micro pattern or a magnetic micro pattern on a substrate surface by tightly pressing a master plate to the substrate surface, and a recording medium made by the method.

Epoch-making enhancement of functions of information devices such as personal computers has brought about a significant increase of the information volume dealt with by users. Under the circumstance, anticipation for information record/reproduce devices with much higher recording densities and semiconductor devices with much higher degrees of integration than now is getting greater and greater.

In order to enhance the recording density, more enhanced micro fabrication techniques are required. Conventional photolithography using an exposure process enables micro fabrication of a large area simultaneously. However, since the technique does not have the resolving power below wavelengths of light, it is difficult to make a microstructure as minute as 100 nm or less, for example, with this technique. As conventional fabrication techniques in the level as minute as 100 nm or less, there are electron beam lithography and focused ion beam lithography among others. A problem with these techniques is a bad throughput.

There is a technique for fabricating a microstructure more minute than wavelengths of light with a high throughput, which is the "nano-imprinting lithography (NIL) technique" proposed in Appl. Phys. Lett.; Vol. 77 (1995) p.3114 in 1995 by S. Y. Chou et al. The nano-imprinting lithography is a technique that prepares a master plate having formed a predetermined embossed micro pattern beforehand by electron beam lithography, for example, and transfers the embossed pattern of the master plate to a resist film of a substrate by pressing the master plate to the substrate coated with the resist. This technique takes much shorter time than electron beam lithography and focused ion beam lithography for one cycle of fabrication per area of one square inch or more.

The existing nano-imprinting process has the following steps.

(1) A resist film of PMMA or the like is coated on a silicon substrate.

(2) The master plate is pressed against the substrate in an atmosphere of a reduced pressure. The pressure is approximately 100 bars.

(3) The substrate coated with the resist is heated to a temperature not lower than the glass transition temperature of the resist.

(4) After a certain duration of time, the master plate and the substrate are cooled to the room temperature.

(5) The master plate is separated from the substrate.

(6) The substrate is obtained with the embossed pattern on the resist.

In the above steps, the step of heating the substrate to the glass transition temperature or higher is necessary for softening the resist and enabling transfer of the embossed pattern even with a low pressure. However, since this step rakes time for heating the substrate and additionally requires the time for the next cooling step, the heating step is a factor of degradation of the throughput.

In case the imprinting is carried out in a heated atmosphere not lower than the glass transition temperature of the resist, since the resist softens, local "exfoliation of the resist film" may occur in the step of separating the master plate from the resist substrate after the imprinting step due to partial cohesion of the resist on the part of the master plate separated away.

The step of the imprinting is carried out in a reduced-pressure atmosphere to prevent local failure of the transfer due to existence of bubbles between the master plate and the resist substrate surface. However, to make the reduced pressure atmosphere for the imprinting, it takes time for degassing by a pump or the like, and this step is another factor of degrading the throughput.

In order to transfer the embossed pattern of the master plate uniformly to the wide area not smaller than one square inch, highly parallel alignment of the master plate surface and the substrate surface is required. Additionally, it is very difficult to uniformly apply the weight over the wide area.

As discussed above, although the nano-imprinting technique is suitable for fabrication of a microstructure as minute as wavelengths of light, and makes it possible to fabricate a microstructure with much higher throughput than electron beam lithography and the lithographic process by focused ion beams, the time required for heating and cooling the substrate adversely affects the throughput, and this technique involves the problems of exfoliation of the film, local failure of transfer of the embossed pattern due to bubbles, difficulty of parallel alignment of the substrate surface and the master plate surface, and difficulty of uniform weighting.

SUMMARY OF THE INVENTION

According to an embodiment of the invention, there is provided a nano-imprinting method for transferring an embossed pattern from a master plate having the embossed pattern to a pattern-receiving surface of a pattern-receiving element, comprising: preparing the master plate having an information carrier region on which the embossed pattern is formed, and a substantially flat information-free region; preparing the pattern-receiving clement having the pattern-receiving surface which has a size corresponding to the information carrier region plus at least a part of the information-free region; preparing a buffer layer which is smaller than the master plate and the pattern-receiving surface and has a shape corresponding to the information carrier region; and applying a pressure to the master plate and the pattern-receiving clement by a pair of press surfaces holding the master plate, the pattern-receiving element and the buffer layer.

According to another embodiment of the invention, there is provided a nano-imprinting method for transferring an embossed pattern from a master plate having the embossed pattern to a pattern-receiving surface of a pattern-receiving element in form of a substantially cylindrical drum having the pattern-receiving surface on a side surface thereof, comprising: preparing the master plate having an information carrier region on which the embossed pattern is formed, and a substantially flat information-free region; preparing the pattern-receiving element having the pattern-receiving surface which has a size corresponding to the information carrier region plus at least a part of the information-free region; preparing a buffer layer which is smaller than the master plate and the pattern-receiving surface and has a shape corresponding to the information carrier region; and pressing and rolling the pattern-receiving element over the master plate placed on a press surface via the buffer layer.

According to yet another embodiment of the invention, there is provided a magnetic printing method for transferring a magnetization state of a magnetized embossed pattern from a master plate having the embossed pattern to a magnetic layer of a magnetization-receiving medium, comprising: preparing the master plate having an information carrier region on which the embossed pattern is formed, and a substantially flat information-free region; preparing the magnetization-receiving medium having a magnetization-receiving surface of the magnetic layer, the magnetization-receiving surface having a size corresponding to the information carrier region plus at least a part of the information-free region; preparing a buffer layer which is smaller than the master plate and the magnetization-receiving surface and has a shape corresponding to the information carrier region; and applying a pressure to the master plate and the magnetization-receiving medium by a pair of press surfaces holding the master plate, magnetization-receiving medium and the buffer layer.

According to yet another embodiment of the invention, there is provided a magnetic printing method for transferring a magnetization state of a magnetized embossed pattern from a master plate having the embossed pattern to a magnetic layer of a magnetization-receiving medium in form of a substantially cylindrical drum having the magnetic layer on a side surface thereof, comprising: preparing the master plate including an information carrier region on which the embossed pattern is formed, and a substantially flat information-free region; preparing the magnetization-receiving medium having a magnetization-receiving surface of the magnetic layer, the magnetization-receiving medium having a size corresponding to the information carrier region plus at least a part of the information-free region; preparing a buffer layer which is smaller than the master plate and the magnetization-receiving surface and has a shape corresponding to the information carrier region; and pressing and rolling the magnetization-receiving medium over the master plate placed on a press surface via the buffer layer.

According to yet another embodiment of the invention, there is provided a recording medium having a data region in which a patterned recording layer is formed, and capable of rotating about a rotation axis to enable at least reproduction or recording of data, characterized in having a positioning pattern in a region within 300 μm adjacent to the data region to be referred to upon reproduction or recording.

These embodiments of the invention make it possible to fabricate a microstructure as minute as 200 nm or less on a large-area region not smaller than one square inch with a high throughput by using the nano-imprinting technique. That is, the embodiments enable fabrication of a high-density recording medium with a high throughput, and are therefore greatly advantageous in the industry

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DETAILED DESCRIPTION OF THE INVENTION

Some embodiments of the invention will now be explained below with reference to the drawings.

Figure 1:
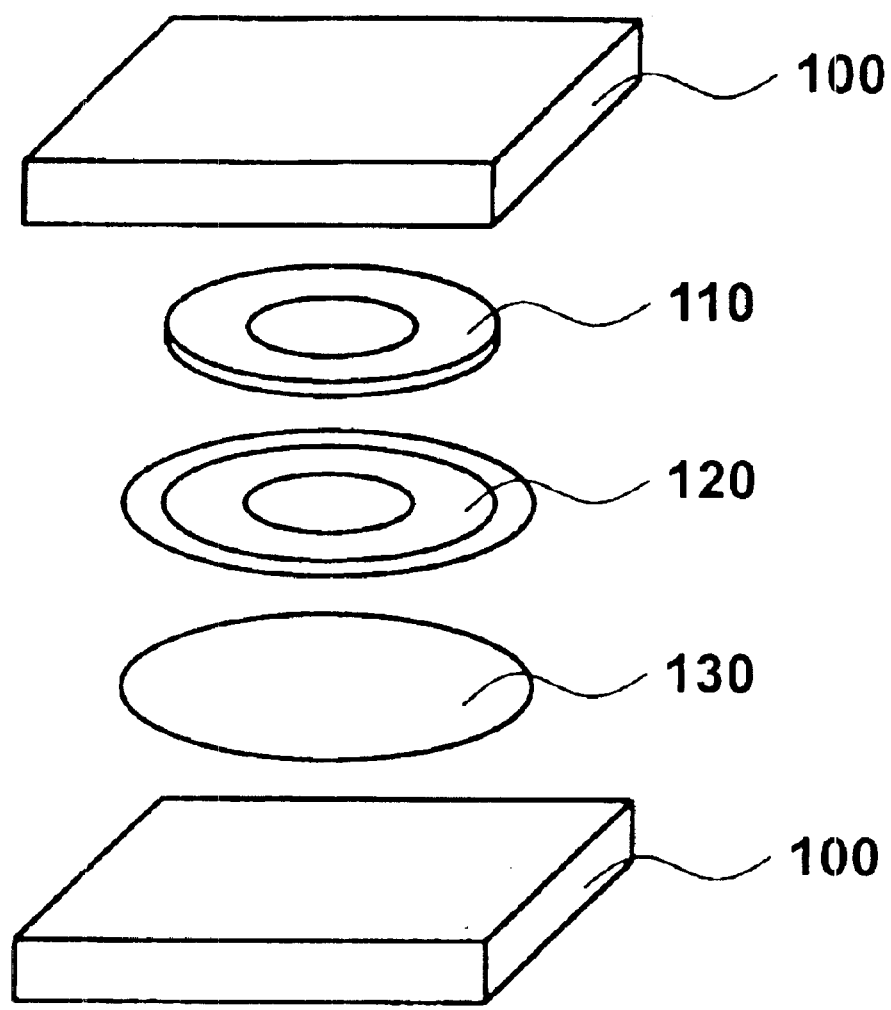
FIG. 1 is a conceptual diagram that shows a nano-imprinting method according to an embodiment of the invention.

FIG. 1 is a conceptual diagram that shows a nano-imprinting method according to an embodiment of the invention. The nano-imprinting method according to an embodiment of the invention is a development of the conventional nano-imprinting technique, and individual components between upper and lower press surfaces have positional relations shown below.

(Press surface 100)

(Buffer layer 110)

(Master plate 120)

(Pattern-receiving or donee substrate 130 to which a pattern should be transferred)

(Press surface 100)

Figure 2:
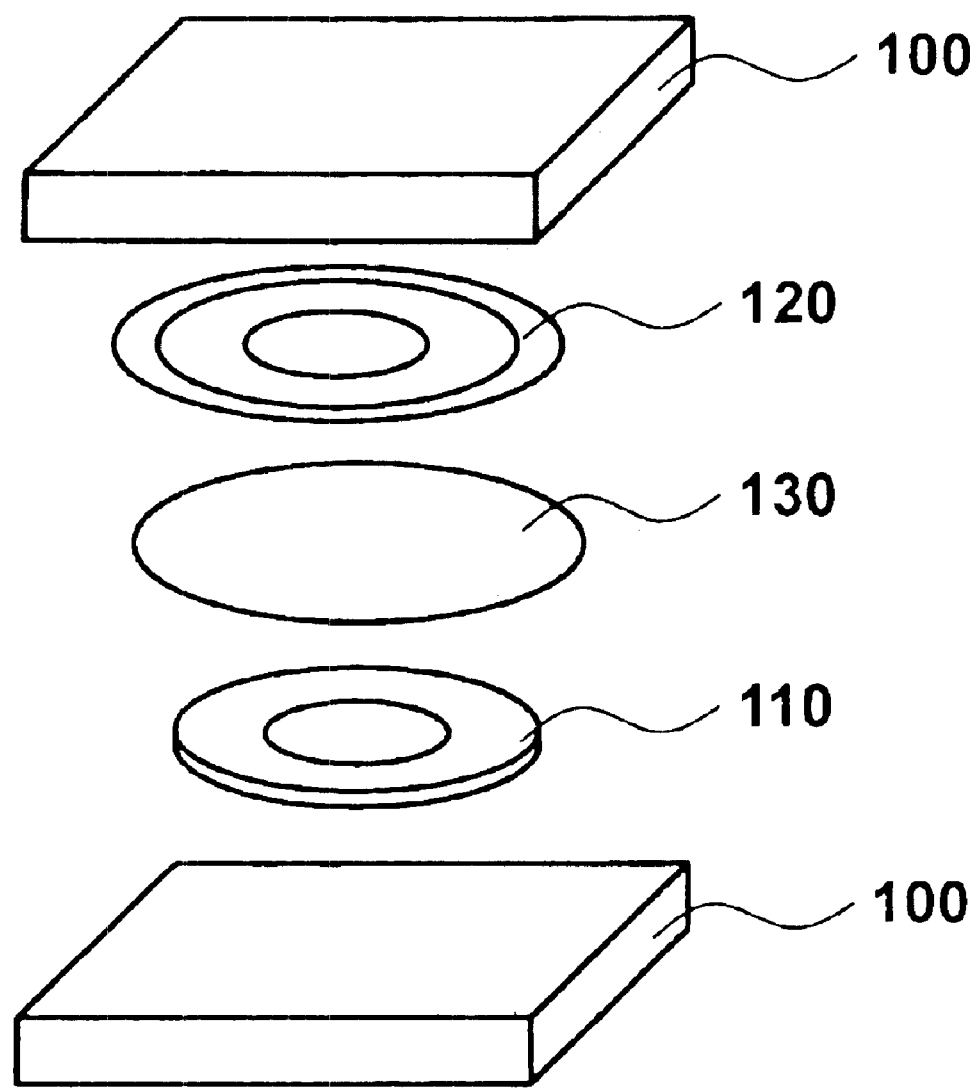
FIG. 2 is a conceptual diagram that shows a nano-imprinting method according to an embodiment of the invention.

Alternatively, the following positional relations shown in FIG. 2 are acceptable.

(Press surface 100)

(Master plate 120)

(Donee substrate 130)

(Buffer layer 110)

(Press surface 100)

In the nano-imprinting method according to the embodiment, the buffer layer 110 is provided on only one of the master plate 120 and the donee substrate 130, and it is never provided on both the master plate 120 and the donee substrate 130.

The buffer layer need not be an independent member, but may be an integral part of the press surface or master plate 120, for example.

By using this structure, the method according to the embodiment applies a pressure from upper and lower press surfaces 100 and transfers the pattern from the master plate 120 to the substrate 130. The donee substrate 130 may have any of various configurations such as a substrate coated with a resist, for example.

The buffer layer 110 used in the embodiment is explained below.

Upon the nano-imprinting process, the flat master plate 120 must be pressed against the flat donee substrate 130, and the imprinting plane need uniform weighting. If the weighting to the imprinting plane is not uniform, transfer of the pattern may results in fail due to local failure of the pattern transfer to the donee substrate 130 or fluctuation of the depth of indention of the pattern in the donee substrate even though the depth of the indention is uniform in the master plate 120.

In the imprinting step, the press machine tightly holds the master plate 120 and the donee substrate 130 between the upper and lower press surfaces 100, 100. In this case, local "unevenness" is produced in the imprinting unless all of the upper and lower press surfaces 100, master plate 120 and donee substrate 130 are parallel. If the depth of indention (difference in level between depressions and projections of the convecoconcave pattern) of the master plate 120 is 100 nm, then the degree of parallelism required among the upper and lower press surfaces 100, master plate 120 and donee substrate 130 is within 10 nm, and it is difficult to meet this condition. Additionally, in the imprinting process, since the upper and lower press surfaces 100, master plate 120 and donee substrate 130 are subject to "deflection" due to weighting to the entire press surface, uniform weighting is difficult.

The buffer layer 110 in the embodiment is indispensable for uniform imprinting over the plane as wide as one square inch or more. The buffer layer 110 is preferably made of a material softer than the upper and lower press surfaces 100, master plate 120 and a part of the donee substrate 130 supporting the resist, The "soft material" herein means a material having a high Young's modulus, low glass transition temperature or melting point.

One of roles of the buffer layer 110 is locally weighting to important portions of the master plate 120 and the donee substrate 130 in the imprinting process. Additionally, the buffer layer 110 fills regions of the upper and lower press surfaces 100, master plate 120 and donee substrate 130 failing to oppose in parallel to each other due to deformation caused by a pressure in the imprinting process such that the weight profile is distributed to ensure uniform weighting by distributing.

Figure 3:
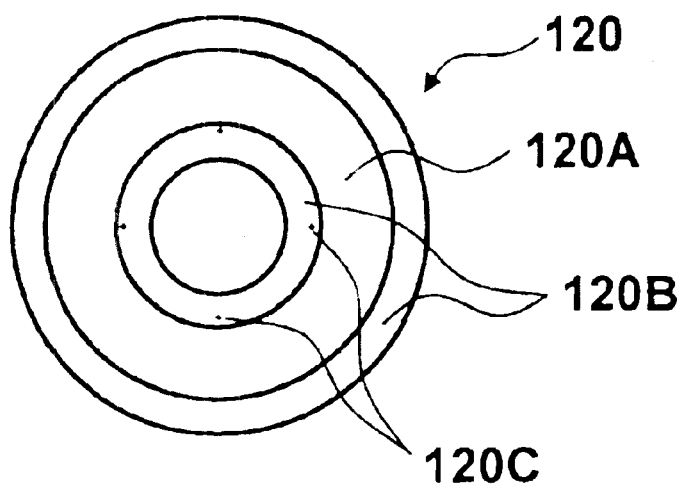
FIG. 3 is a schematic diagram that shows a surface configuration of a master plate.

FIG. 3 is a schematic diagram that shows a surface configuration of the master plate 120. The master plate 120 has a pattern carrier (information carrier region) 120A on its top surface, on which an embossed pattern to be transferred is formed. The information carrier region 120A corresponds to a data region in case of a recording medium, for example. The pattered region 120A is surrounded by a blank region (information-free region) 120B. The blank region 120B is provided for easier handling of the donee substrate 130 or for physical strength. The blank region 120b does not have any substantial pattern to be transferred. In case of a disk substrate, however, a positioning pattern 120C, for example, may be formed in the blank region 120B for determination of the rotation axis.

The buffer layer 110 according to the embodiment preferably has a configuration corresponding to the embossed pattern 120A formed on the master plate 120.

If the weight is applied by simply stacking the master plate 120 and the donee substrate 130 and compressing them between the upper and lower press surfaces, the weight is applied also to the blank region 120B. However, the mode or degree of pressure to the blank region is different from the mode or degree of pressure to the region having the pattern to be transferred. Therefore, a failure of transfer is liable to occur due to "deflection" of the master plate 120 and the donee substrate 130 a loss of the pressure in the patterned region.

The embodiment of the invention, however, uses the buffer layer 110 to lie substantially only in a limited region approximately corresponding to the pattern carrier region 120A formed on the master plate 120. In this manner, it is possible to efficiently apply the pressure from the press machine to the pattern carrier of the master plate 120 in the imprinting process by preventing weighting to the blank region 120B.

The "pattern carrier" can be defined by a contour made by a curve that surrounds the embossed pattern formed on the master plate 120 to be transferred with the radius of curvature being 1 $\mu$m, for example. Therefore, if the donee substrate 130 is the recording surface of CD (compact disk) or DVD (digital versatile disk) having an opening in its center, the buffer layer 110 is preferably donut-shaped without the central region corresponding to the opening.

In a more specific definition The buffer layer in configuration, the buffer layer 110 is preferably slightly larger than the pattern carrier 120A of the master plate 120. More specifically, the buffer layer is preferably larger than the strict outer contour of the pattern carrier 120A to include the surpassing region beyond the contour preferably by 3 mm or less, or more preferably by 1 mm or less.

However, if the master plate 120 has an embossed pattern such as a positioning pattern 120C in the blank region 120B as well, the shape and size of the buffer layer 110 are preferably determined to cover the embossed pattern as well.

Next to the above detailed explanation of the buffer layer in the embodiment of the invention, explanation will be made about the pressure applied from the upper and lower press surfaces 100 in the instant embodiment.

In the existing techniques, embossed patterns are transferred to donee substrates with a pressure not higher than 100 bar. Therefore, temperature in the imprinting process has to be raised to or higher than the glass transition temperature at which the resist film softens, and this is one of factors degrading the throughput.

In contrast, the embodiment of the invention uses a pressure not lower than 500 bar in the imprinting process. As a result, the imprinting temperature need not be raised to the glass transition temperature of the resist film, and the embossed pattern can be transferred from the master plate 120 to the donee substrate 130 at room temperatures or at temperatures not higher than 80° C. even if heated. This contributes to saving or significantly reducing the time for heating and cooling the master plate 120 and the donee substrate 130, and to significantly reducing the throughput.

Additionally, by employing the imprinting pressure not lower than 500 bar, residual bubbles between the master plate 120 and the donee substrate 130 are compressed to 1/500 or less. As a result, failure of pattern transfer, which may be caused by bubbles during transfer of the pattern to the donee substrate 130, can be removed substantially.

Also when the master plate 120 is separated from the donee substrate 130, the bubbles compressed in the imprinting process return to the original volume and exert a force pushing back the master plate 120. Therefore, in the process of separating the master plate 120 from the donee substrate 130, "film exfoliation" by adhesion of the resist film to the master plate 120 can be prevented as well. In other words, bubbles compressed to a high pressure exist as a thin protective layer not damaging the embossed pattern between the master plate 120 and the donee substrate 130, and prevents or alleviates exfoliation of the resist.

Table 1 summarizes transfer qualities of the embossed pattern under various conditions of the imprinting pressure and temperature, existence of bubbles and existence of exfoliation of the resist film. Qualities of transfer, existence of bubbles and existence of exfoliation of the resist film were evaluated by observation through an optical microscope.

layer 110, such as a metal, alloy, metal oxide, inorganic material, ceramic material or any of their compounds or mixtures. More specifically, hardened steel or stainless material can be used.

The upper and lower press surfaces 100 preferably have a high degree of flatness and parallelism. As to the flatness, the surface roughness is preferably smaller than 10 μm and more preferably smaller than 1 μm near the master plate 120 and the donee substrate 130 for the imprinting. Thickness of the gap between the press surfaces 100 existing when they alone are pressed without sandwiching the master plate 120, donee substrate 130, buffer layer 110 or anything else is preferably thinner than 10 μm and more preferably thinner than 1 μm.

The master plate 120 is preferably made of a material unlikely to suffer deformation of the embossed pattern on its surface in the imprinting process. For example, metals, alloys, metal oxides, inorganic materials, ceramic materials, semiconductors, glass or their compounds and mixtures are usable. Additionally, the master plate 120 is preferably flexible to a certain extent in accord with accidental undulation of the surface of the donee substrate 130 in the imprinting process. For this purpose, it is preferably made of a material softer than the material of the upper and lower press surfaces 100. The inventor could obtain a favorable result especially when using nickel (Ni), aluminum (Al), etc.

The embossed structure of the pattern carrier 120A formed on the top surface of the master plate 120 has a structure not larger than 200 nm, which is suitable for fabrication of a high-density recording medium. More specifically, it includes a groove structure having a width not larger than 200 nm, ridge structure having a width not larger than 200 nm, and one of dot structure, column structure and

TABLE 1

| Pressure | 100 bar | 100 bar | 500 bar | 500 bar | 1000 bar | 1000 bar |
|---|---|---|---|---|---|---|
| Temperature | Room temperature | 150° C. | Room temperature | 150° C. | Room temperature | 150° C. |
| Transfer quality | x | ○ | Δ | ○ | ○ | ○ |
| Bubbles | Non | Exist | Non | Non | Non | Non |
| Film exfoliation | Non | Exist | Non | Exist | Non | Exist |

It is appreciated from Table 1 that it is necessary to raise the press temperature to around 150° C. in order to ensure an acceptable transfer quality under the pressure around 100 bar. However, when the temperature is raised to this level of temperature, bubbles are observed, or exfoliation occurs.

In contrast, when the pressure is raised to 500 bar, a certain degree of transfer is possible even at room temperatures, and bubbles and exfoliation are prevented. When the pressure is raised to 1000 bar, excellent pattern transfer is ensured at room temperatures, and bubbles and film exfoliation are removed.

Heretofore, the buffer layer 110 and the pressure employed in the embodiment have been explained.

Next made is a brief explanation about other elements.

As the press machine for carrying our the imprinting process as shown in FIG. 1, an ordinary hydraulic press machine may be used, for example. The press surface 100 of the press machine is preferably made of a material harder than the master plate 120, donee substrate 130 and buffer hole structure having a width not larger than 200 nm. The embossed structure preferably has a depth suitable for etching or other semiconductor fabricating process after the imprinting process. More specifically, a depth not larger than 200 nm is preferable. Structure of the embossed pattern in the depthwise direction preferably has a tapered opening enlarged upwardly by one degree to 60 degree to facilitate separation of the donee substrate 130 from the master plate 120 after the imprinting process. Additionally, tops and bottoms of the embossed pattern structure preferably flat with roughness not exceeding 10 nm.

The donee substrate 130 on which the embossed pattern should be transferred is preferably made of a material suitable for the high-density recording medium to be fabricated. For example, metals, alloys, metal oxides, inorganic materials, ceramic materials, semiconductors, glass or their compounds and mixtures are usable.

In case a resist or other material is coated on the donee substrate 130, the material is preferably suitable for etching or other process after the imprinting process, depending on the target high-density recording medium. Resist materials, polymeric materials typically used in semiconductor processes are also usable here.

The resist material is preferably a material capable of reliably transferring the embossed pattern from the surface of the master plate 120 in the imprinting process and softer than the material of the master plate 120. A material stable enough to maintain the transferred embossed pattern at room temperatures after the imprinting process is desirable. That is, the resist preferably has a glass transition temperature and melting point not lower than room temperatures. Additionally, a material soft enough to permit transfer of the embossed pattern from the master plate 120 under the pressure not lower than 500 bar is preferable, and the glass transition point is preferably 100 degrees or higher.

Material of the buffer layer 110 is preferably softer than materials of the upper and lower press surfaces 100, master plate 120 and donee substrate 130 to reliably bury the gap produced by "deviation" of the parallelism among the upper and lower press surfaces 100, master plate 120 and donee substrate 130 in the imprinting process and to thereby ensures uniform imprinting. Materials usable as the buffer layer 110 are metals, alloys, metal oxides, inorganic materials, polymeric materials, ceramic materials, semiconductors, glass or their compounds and mixtures. More specifically, a polymer film, rubber, Teflon (trade mark), glass, paper, metal, alloy, metal oxide, inorganic material, ceramic material, semiconductor, or their compound, mixture or multi-layered structure are desirable.

Next explained is a recording medium to be fabricated by the above-explained imprinting process.

The recording medium obtained by the embodiment of the invention is characterized in that the "positioning pattern" formed on the surface of the recording medium to point the position of the center axis upon rotation of the medium is located at a distance within 300 $\mu$m from the nearest portion of the data region on the recording medium.

In case a disk-shaped recording medium is fabricated, the donee substrate 130 having the imprinting pattern made by the method shown in FIG. 1 is loaded on a spindle motor through one or more other later steps such as etching, and undergoes a processing such as servo write. In this process, the center of the embossed pattern transferred to the donee substrate 130 must be brought into axial alignment with the center portion of the spindle motor, and the "positioning pattern" for this axial alignment plays the very important role.

Figure 4:
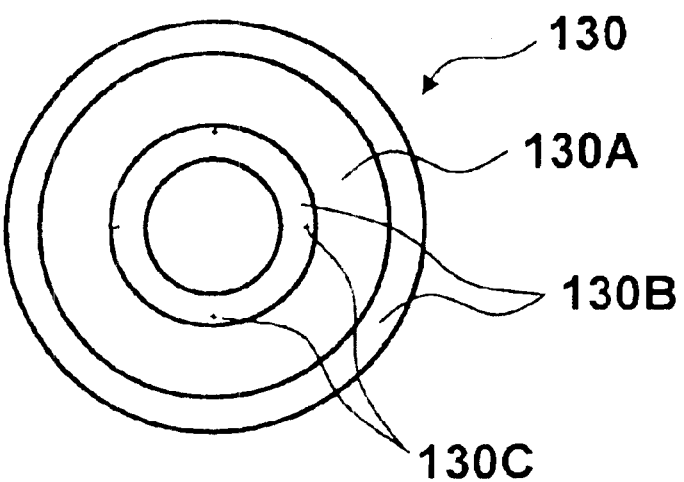
FIG. 4 is a schematic diagram that exemplifies a positional relation on a substrate between a positioning pattern for axial alignment and a region for making an embossed pattern.

FIG. 4 is a schematic diagram that exemplifies a positional relation on the substrate between the positioning pattern for axial alignment and the region for making an embossed pattern. As illustrated here, the substrate 130 of the disk-shaped recording medium includes thereon a pattern-forming region 130A for making an embossed pattern and blank regions 130B, namely additional flat regions, next to opposite perimeters of the pattern-forming region 130A. The blank regions 130B have a positioning pattern 130C for axial alignment.

The positioning patterns 130C are usable for determining the position of the center axis of the pattern, and may be a set of four points, for example, such that the center axis is located at the crossing point of two lines each connecting diagonal two points. The positioning pattern 130C is preferably located slightly distant from the pattern-forming region 130A not interfering the pattern-forming region 130A and facilitating visual detection through a microscope or detection of an optical sensor.

In case of the imprinting technique shown in FIG. 1, the position of the center axis of the embossed pattern is already known upon making the embossed pattern on the master plate 120. Therefore, the positioning pattern for alignment of the center axis can be drawn on the top surface of the master plate 120 simultaneously with the embossed pattern. Thus, by transferring the positioning pattern on the master plate 120 simultaneously with the transfer of the embossed pattern upon transferring the embossed pattern from the master plate 120 thus prepared to the resist disk substrate 130, it is possible to accurately determine the center axis position of the embossed pattern on the donee substrate 130.

The buffer layer 110 used in the embodiment preferably has a configuration approximately identical to the pattern carrier of the master plate 120 as already explained above. However, if the positioning pattern 130C is located too far from the pattern-forming region 130A, since the buffer layer 110 must apply the pressure also to the positioning pattern 130C distant from the pattern-forming region 130A in the imprinting process, it undesirably results in applying a pressure also to the blank regions 130B existing between the positioning pattern 130C and the pattern-forming region 130A.

Taking it into account, the embodiment locates the positioning pattern 130C as near as possible to the pattern-forming region 130A before forming the positioning pattern 130C on the master plate 120. More specifically, the positioning pattern 130C is preferably located in the region within 300 $\mu$m from the pattern-forming region 130A. In this manner, weighting to the blank regions 130B can be minimized even when the positioning pattern 130C exists.

Table 2 summarizes changes of the transfer quality of the pattern-forming region 130A obtained by observation while changing the distance between the pattern-forming region 130A and the positioning pattern 130C. Shapes and sizes of the substrate 130 and the pattern-forming region 130A are based on the DVD standard, and buffer layers 110 of various sizes from one covering the pattern-forming region 130A to another covering the positioning pattern 130C as well.

A 300 $\mu$m thick nickel (Ni) plate was used as the master plate 120.

TABLE 2

| Distance between the pattern-forming region and the positioning pattern | 100 $\mu$ | 300 $\mu$ | 500 $\mu$ | 1 mm |
|---|---|---|---|---|
| Transfer quality | ○ | ○ | Δ | X |

As shown in Table 2, when the positioning pattern 130C is located in the region within 300 $\mu$m from the pattern-forming region 130A, the transfer quality in the pattern-forming region 130A is favorable. However, when the distance to the positioning pattern 130C is increased to 500 $\mu$m, the transfer is somewhat insufficient. When the positioning pattern 130C is brought apart to 1 mm from the pattern-forming region 130A, the transfer is insufficient.

This result is presumed to relate to the fact that the weight to the blank regions 130B increases as the buffer layer 110 is enlarged. That is, to ensure favorable transfer in the embodiment, it is important to limit the region for weighting to the pattern-forming region 130A as far as possible. Therefore, the positioning pattern 130C is preferably located as close as possible to the pattern-forming region 130A within the extent without interference, namely, within the range not remoter than 300 $\mu$m.

As such, by locating the positioning pattern 130C in the extreme proximity to the pattern-forming region 130A, "deviation" of the positional relation between the positioning pattern 130C and the pattern-forming region 130A can be minimized even when accidental, local "deflection" occurs in the disk substrate. Therefore, deviation of the center axis position by deflection of the disk substrate can be prevented as well.

Heretofore, explanation has been made about the imprinting technique for obtaining a disk-shaped recording medium by using a flat press surface with reference to FIGS. 1 through 4. However, the invention is not limited to the foregoing embodiment, but it is similarly applicable to a drum-type recording medium, for example, as well.

Figure 5:
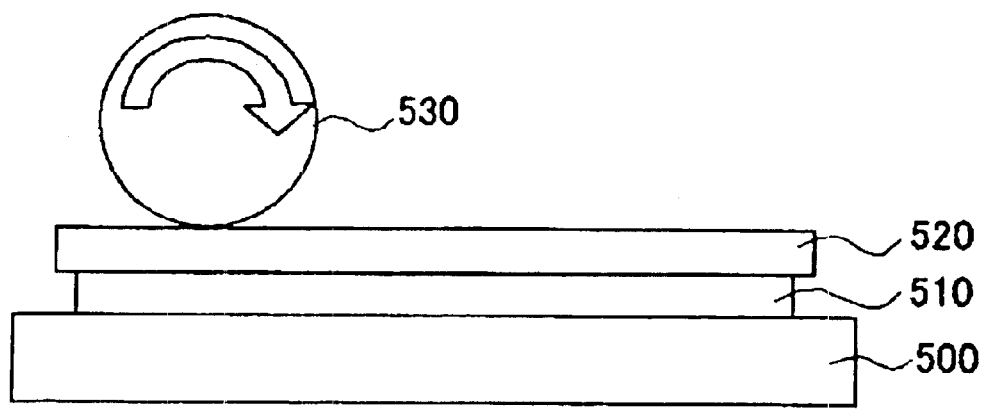
FIG. 5 is a schematic cross-sectional view for explaining a method of manufacturing a drum-type recording medium according to an embodiment of the invention.

FIG. 5 is a schematic cross-sectional view for explaining a method of manufacturing a drum-type recording medium according to an embodiment of the invention.

When a drum-type recording medium is fabricated, a buffer layer 510 and a master plate 520 are stacked on a flat press surface 500 as shown in FIG. 5, and a roller-shaped donee member 530 is rolled over it under a pressure.

Figure 6:
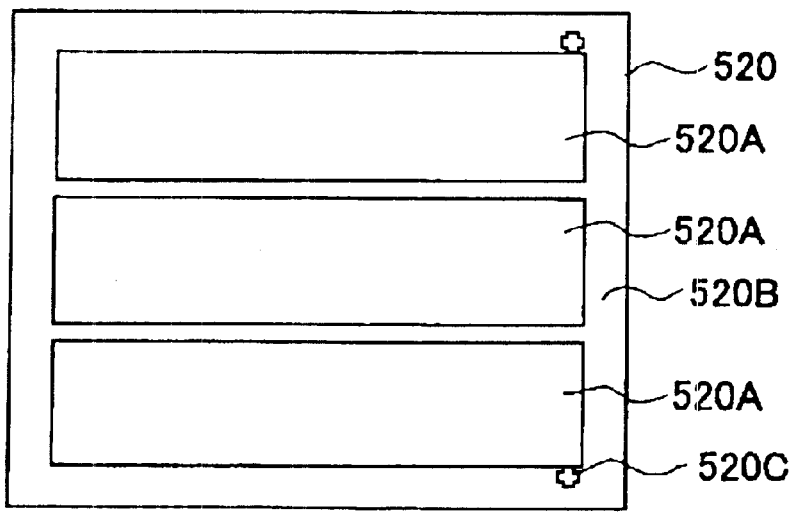
FIG. 6 is an extension plan of a pattern carrier surface of a master plate 520.

As shown in FIG. 6, small elongated pattern carrier regions 520A are aligned on a rectangular plane, for example, of the top surface of the master plate 520. They correspond to the patter carrier region 120A shown in FIG. 3. Outside the pattern carrier regions 520A, blank regions 520B are provided. They correspond to the blank regions 120B shown in FIG. 3.

In the blank region 520B, a positioning pattern is located. This also corresponds to the positioning patter 120C shown in FIG. 3.

The press process is carried out by urging the roller-shaped donee member 530 against the master plate 520 and rolling the donee member 530 about the roller axis. In this process, the embossed pattern is transferred from the surface of the flat master plate 520 to the surface of the roller-shaped donee member 530. Although explained later, in the drum-shaped record/reproduce device, the portions having the transferred embossed patterns are used as recording region.

Figure 7:
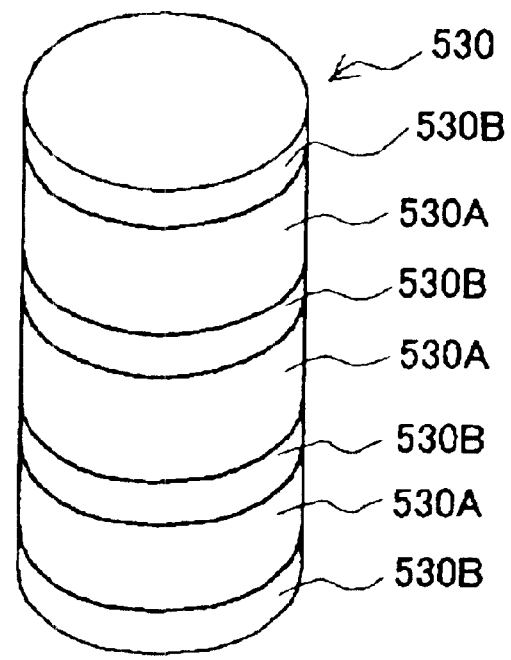
FIG. 7 is a perspective view of a pattern-receiving or donee member 530 on which the embossed pattern has been transferred.

FIG. 7 is a perspective view of a donee member 530 on which the embossed pattern has been transferred.

On the surface of the roller-shaped donee member 530, the record regions 530A having formed the embossed patterns corresponding to the pattern carrier regions 520A of the master plate 520 have been transferred, and the blank regions 530B corresponding to the blank regions 520B of the master plate 520 have been formed.

In this embodiment, by configuring the buffer layer 510 and the master late 520 with features similar to those already explained with reference to FIGS. 1 through 4, the minute embossed patterns formed on the master plate 520 can be reliably transferred to the surface of the donee member 530. That is, by sizing the buffer layer 510 smaller than the master plate 520 and the donee member 530 and thereby limiting it to a region approximate to the pattern-forming region 530A, stable transfer is realized.

Figure 8:
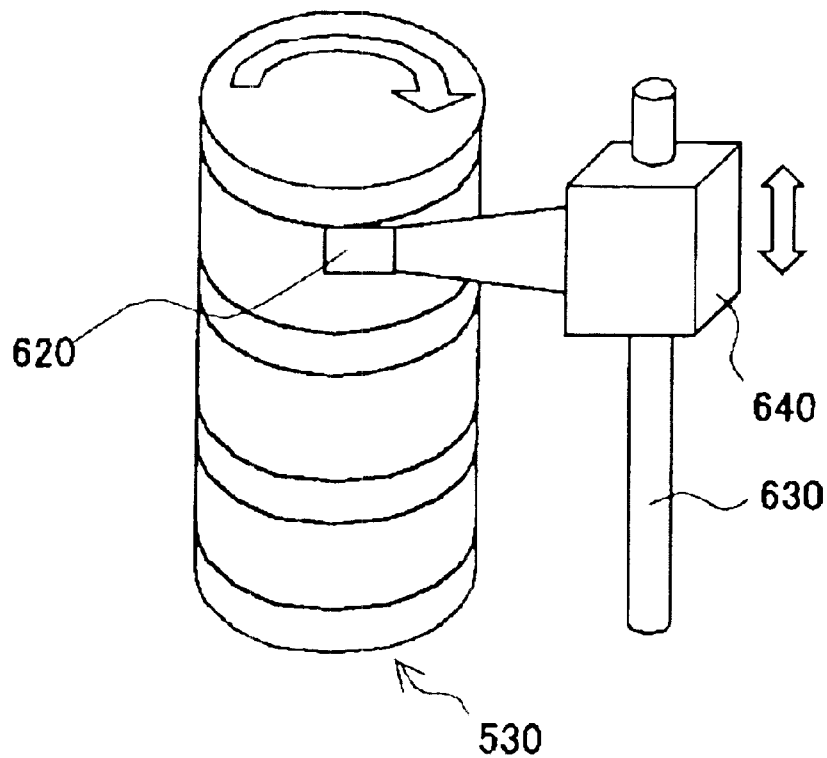
FIG. 8 is a perspective view that exemplifies the structure of a substantial part of a recording/reproduceing device using the drum-type recording medium.

FIG. 8 is a perspective view that exemplifies the structure of a substantial part of a record/reproduce device using the drum-type recording medium.

A drum-type record/reproduce device of this type is disclosed in, for example, Japanese Patent Laid-Open Publications Nos. H05-334749 and H11-86201. The drum-type recording medium 530 rotates about its center axis. On the other hand, a linear drive shaft 630 is provided in parallel to the rotation axis of the recording medium 530, and a record/reproduce head 620 is provided at the distal end of a linear driver 640 configured to move in parallel to the center axis of the drum.

The record/reproduce head 620 is located in contact with the surface of the recording medium. When the linear driver 640 moves along the linear drive shaft 630, the record/reproduce head 620 can access to a certain recording region of the recording medium 530 under rotation.

In case of the disk-shaped recording medium shown in FIG. 4, there is a difference in linear velocity relative to the revolution between the outer circumferential region and the inner circumferential region of the disk. Additionally, in case a record/reproduce mounted on the distal end of a cantilever arm makes access, there is a difference in skew angle between the outer circumferential region and the inner circumferential region of the disk.

In contrast, the drum-type record/reproduce device shown in FIG. 8 has the advantages that the linear velocity relative to the revolution of the recording medium 530 is constant, and the skew angle of the head is constant.

Heretofore, explanation has been made about the disk-shaped recording medium with reference to FIGS. 1 through 4 and bout the drum-type recording medium with reference to FIGS. 5 through 8.

The foregoing manufacturing methods are also applicable to a magnetic printing technique for fabricating a magnetic recording medium such as a hard disk drive (HDD) with a high throughput (for example, Japanese Patent Laid-Open Publication No. H07-78337) and ensure uniform magnetic printing.

This magnetic printing technique is a method that prepares a master disk having magnetic signals such as servo information recorded on the surface beforehand (magnetic recording master disk), bring the master disk and a slave disk (donee medium) having a magnetic layer on its top surface into close contact, holding them between press surfaces and applying a pressure, and applying a bias magnetic field from outside to transfer magnetic information from the master disk to the slave disk.

By using the master disk in the magnetic printing technique as the master plate used in the embodiment of the invention and using the slave disk used in the magnetic printing technique as the donee substrate, uniform magnetic printing is possible over the entire substrate surface. That is, while the buffer layer of a shape corresponding to the region with a magnetically recorded signal on the master disk is interposed at the position corresponding to the magnetic signal region between the master disk or slave disk and the press surfaces, by applying the pressure and applying a bias magnetic field from outside, magnetic information can be transferred from the master disk to the slave disk uniformly over the entire disk surface.

EXAMPLES

Embodiments of the invention are explained below in greater detail with reference to some examples. The invention, however, is not limited to these examples.

Example 1

First as Example 1 of the invention, a recording track band was formed by making a groove region on a substrate by the nano-imprinting technique and burying the groove region with a magnetic material.

FIGS. 9A through 9F are cross-sectional views for explaining a manufacturing method of a magnetic recording medium according to Example 1 of the invention.

Figure 9A:
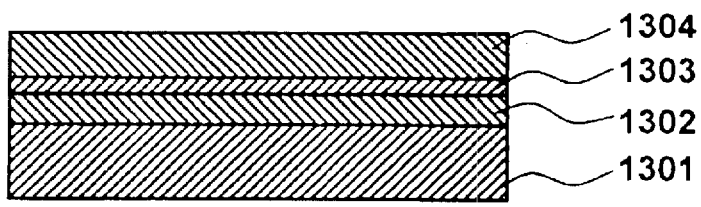
FIGS. 9A through 9F are cross-sectional views for explaining a manufacturing method of a magnetic recording medium according to Example 1 of the invention.

First as shown in FIG. 9A, the donee substrate 130 was formed. More specifically, a magnetic layer 1302 was formed on a glass disk substrate 1301 sized 2.5 inches in diameter by depositing an approximately 30 nm thick palladium (Pd) base layer and approximately 50 nm thick cobalt chromium platinum (CoCrPt) as a vertically magnetized recording material, and an approximately 50 nm thick $SiO_2$ film 1303 was deposited on the magnetic layer 1302. Additionally, a resist 1303 was coated on the $SiO_2$ film 1303 by spin coating.

Figure 9B:
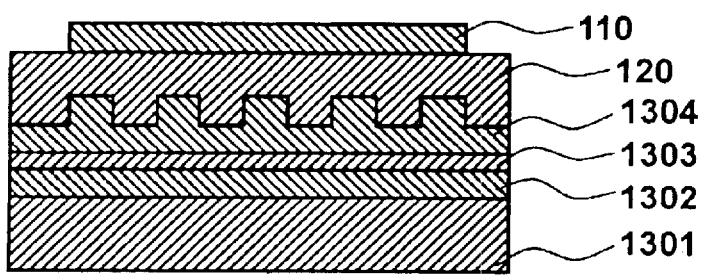

Next as shown in FIG. 9B, the master plate 120 was put in pressure contact for imprinting.

The master plate was prepared in the manner explained below. A groove or indention structure sized 100 nm in width of each groove, 100 nm in groove-to-groove distance and 100 nm in height was formed in a region sized 24 mm to 30 mm in radius on a glass master plate by electron beam lithography. Simultaneously, four cross marks were formed as a center axis positioning pattern in intervals of 90 degrees in rotation angle inside by 100 $\mu$m from the perimeter of an embossed structure sized 24 mm in radius. On the top surface of the glass master plate, a 300 $\mu$m thick nickel was formed by plating. Then the nickel film was separated and cut away from the glass master plate. Thus the nickel master plate of a diameter of 65 mm and a thickness of 300 $\mu$m was obtained, which has the groove structure with concentrical grooves sized 100 nm in width of each groove, 100 nm in groove-to-groove distance and 100 nm in height in the region from 24 mm to 30 mm in radius from the center and four cross marks as the center axis positioning pattern in intervals of 90 degrees in rotation angle inside by 100 $\mu$m from the perimeter of an embossed structure sized 24 mm in radius.

The nano-imprinting was carried out as follows by using the structure exemplified in FIG. 1.

A PET sheet sized 23 mm in inner diameter, 31 mm in outer diameter and 1 mm in thickness was prepared as the buffer layer 110. Then individual elements were placed as shown below in a press machine.

(Upper press surface 100)
(Buffer layer 110)
(Master plate 120)
(Donee substrate 130)
(Lower press surface 100)

In the press process, the pressure of 1000 bar is applied in the atmospheric air for 10 seconds.

After the press process, the upper and lower press surfaces 100 are moved and separated, and the buffer layer 110 and the master plate 120 were removed from the donee substrate 130 with vacuum forceps.

Figure 9C:
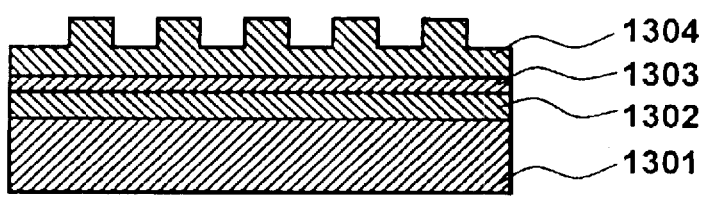

Through these steps, the embossed pattern was transferred from the master plate 120 to the top surface of the resist film 1304 as shown in FIG. 9C. The surface of the donee substrate 130 after the imprinting process was observed by AFM (atomic force microscope), and it was confirmed that the groove structure with concentrical grooves sized 100 nm in width of each groove, 100 nm in groove-to-groove distance and 100 nm in height was certainly formed in the region from 24 mm to 30 mm in radius from the center and that four cross marks as the center axis positioning pattern were formed in intervals of 90 degrees in rotation angle inside by 100 $\mu$m from the perimeter of an embossed structure sized 24 mm in radius. Additionally, the top and bottom of the groove structure were confirmed to have the flatness not larger than 10 nm in the region having a width not smaller than 60 nm.

Figure 9D:
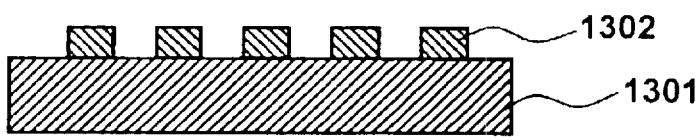

Next as shown in FIG. 9D, the magnetic layer 1302 was patterned. More specifically, using the resist film 1304 having the transferred embossed pattern as a mask, the $SiO_2$ film 1303 was etched by RIE (reactive ion etching) to the level of the top surface of the magnetic layer 1302 to thereby transfer the pattern on the $SiO_2$ film, and next using this pattern, the magnetic layer 1302 was etched. The groove region formed in this manner functions as the isolating region, and the patterned magnetic layer 1302 serves as a recording track band.

Figure 9E:
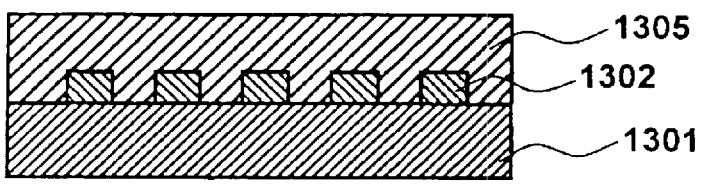

Next as shown in FIG. 9E, the isolating region was formed by forming an approximately 50 nm $SiO2$ film 1305 over the entire substrate surface to bury the groove portion of the magnetic layer 1302.

Figure 9F:
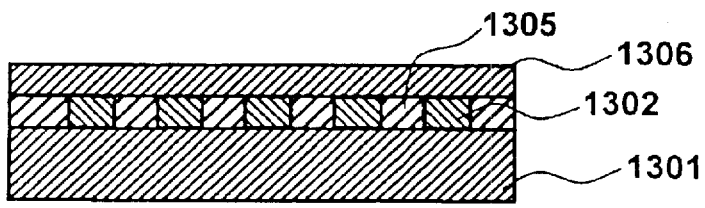

After that, the surface of the $SiO_2$ film 1305 was polished and smoothes by chemical mechanical polishing (CMP). Additionally, by forming a film of diamond-like carbon as the protective film 1306 on the entire surface, the magnetic recording medium as shown in FIG. 9F was obtained.

The magnetic recording disk medium obtained in this manner was set on an air spindle motor by aligning its center as therewith by making use of the positioning pattern transferred simultaneously in the imprinting process, and through the step of making a servo pattern and subsequent manufacturing processes normally used for HDD (hard disk drive), the magnetic recording medium was completed.

Figure 10:
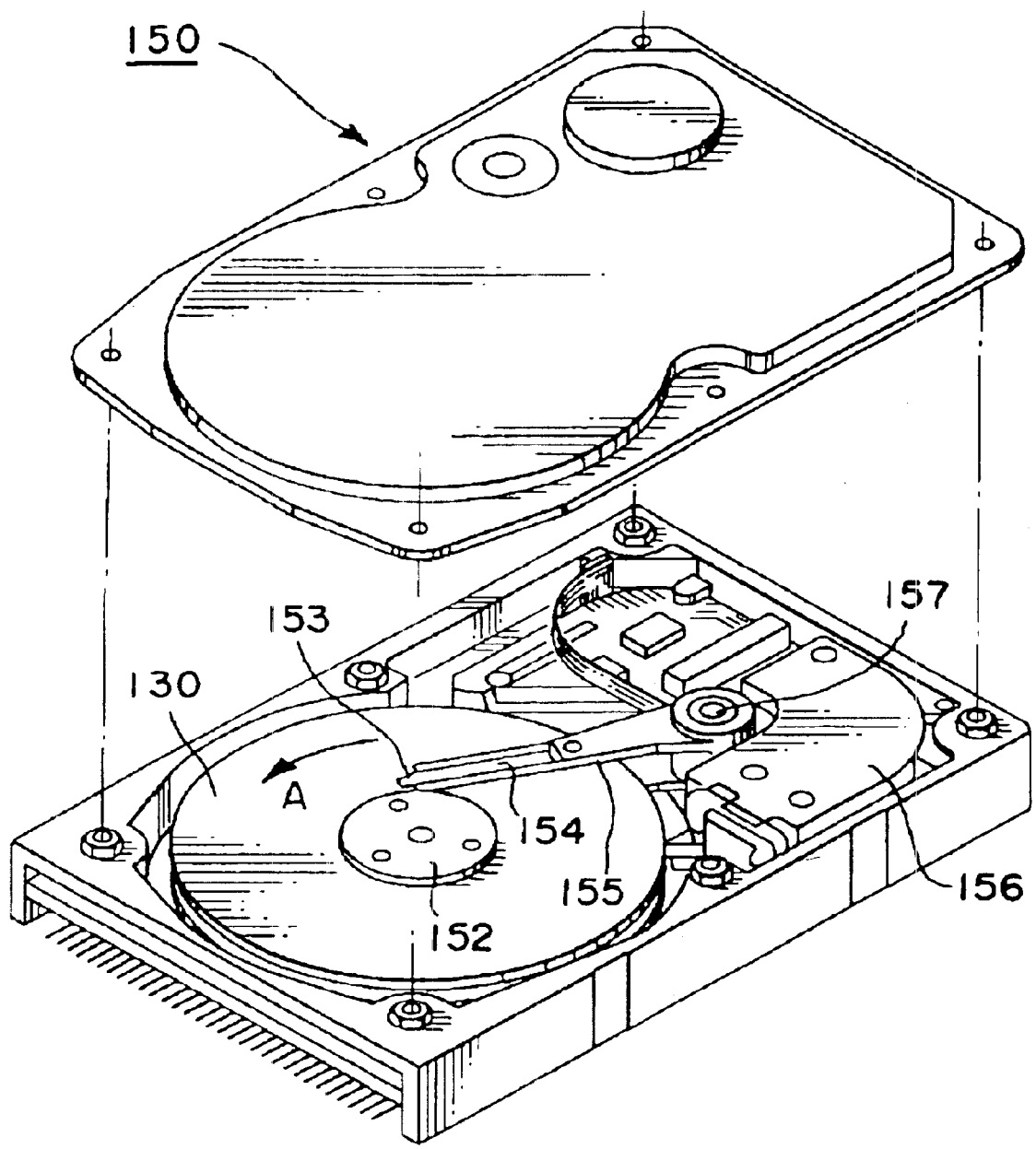
FIG. 10 is a perspective view that exemplifies the general configuration of a substantial part of HDD.

FIG. 10 is a perspective view that schematically shows a configuration of a major part of a magnetic recording/reproducing apparatus according to the embodiment of the invention. The magnetic recording/reproducing apparatus 150 according to the invention is an apparatus of a type using a rotary actuator. In FIG. 10, a recording magnetic disk 130 according to the embodiment of the invention is mounted on a spindle 152 and rotated in the arrow A direction by a motor, not shown, which is responsive to a control signal from a drive device controller, not shown. The magnetic recording apparatus according to the embodiment of the invention may also include a plurality of recording magnetic disks 130.

A head slider 153 executed recording or reproduction of information to be stored in the magnetic disk 130 is attached to the tip of a thin-film suspension 154. The head slider 153 includes a magnetic head having a giant magnetoresistive effect element, for example, near its tip.

When the magnetic disk 130 rotates, the medium-facing surface (ABS) of the head slider 153 is held with a predetermined floating amount from the surface of the magnetic disk 130. Alternatively, the apparatus may employ a contact-type configuration where the slider 153 is in contact with the disk 130 during the operation.

The suspension 154 is connected to one end of an actuator arm 155 that has a bobbin portion for holding a drive coil, not shown. At the other end of the actuator arm 155, a voice coil motor 156, which is a kind of linear motor, is provided. The voice coil motor 156 is composed of a drive coil, not shown, wound up on the bobbin portion of the actuator arm 155, and a magnetic circuit made up of a permanent magnet and an opposed yoke disposed in confrontation so as to sandwich the drive coil.

The actuator arm 155 is held by ball bearings, not shown, which are provided upper and lower two positions of a rigid shaft 157 for free rotational and slidable movements with a driving force from the voice coil motor 156.

According to Example 1, by using the magnetic record/reproduce disk 130 according to the embodiment of the invention explained with reference to FIG. 4, the magnetic recording layer with a 100 nm pitch pattern can be easily formed on the entire surface of the recording area of the 2.5 inch disk substrate 130, and an ultra-high density magnetic recording system can b realized.

Example 2

Next explained is an experimentally fabricated phase-change optical recording medium as Example 2 of the invention.

FIGS. 11A through 11F are cross-sectional views for explaining a manufacturing method of the phase-change optical recording medium according to Example 2 of the invention.

Figure 11A:
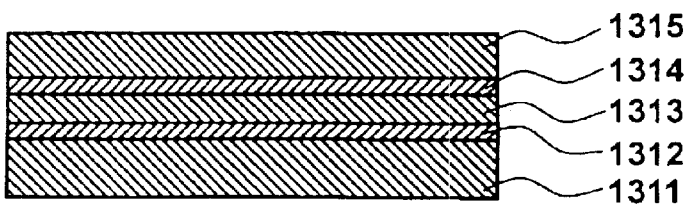
FIGS. 11A through 11F are cross-sectional views for explaining a manufacturing method of a phase-change optical recording medium according to Example 2 of the invention.

First as shown in FIG. 11A, the donee substrate 130 was formed. More specifically, on a glass disk substrate 1301 sized 2.5 inches in diameter, an approximately 30 nm thick platinum (Pt) reflection film 1312, approximately 50 nm thick $Al_2O_3$ film 1313 as the matrix, and approximately 50 nm thick $SiO_2$ film 1314 were formed. After that, a resist 1315 was coated on the $SiO_2$ film by spin coating.

Figure 11B:
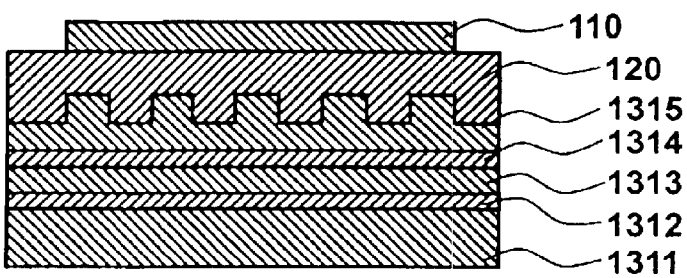

Next as shown in FIG. 11B, imprinting of the master plate 120 was carried out. The master plate 120 used for the imprinting was prepared by the same steps as those of Example 1. Thus the nickel master plate of a diameter of 65 mm and a thickness of 300 μm was obtained, which has the groove structure with concentrical grooves sized 50 nm in width of each groove, 50 nm in groove-to-groove distance and 100 nm in height in the region from 24 mm to 30 mm in radius from the center and four cross marks as the center axis positioning pattern in intervals of 90 degrees in rotation angle inside by 100 μm from the perimeter of an embossed structure sized 24 mm in radius.

Using this master plate 120 and the same nano-imprinting process as that of Example 1, the embossed pattern was transferred from the master plate 120 to the donee substrate 130.

Figure 11C:
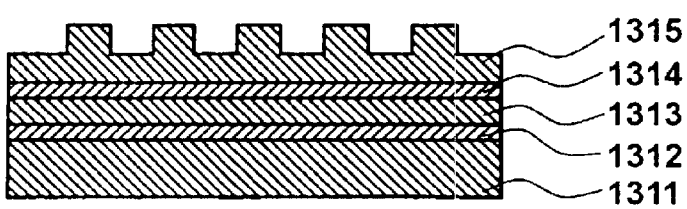
Figure 11D:

As shown in FIG. 11C, the donee substrate 130 was separated from the master plate 120, and its surface was observed by AFM. As a result, it was confirmed that the groove structure with concentrical grooves sized 50 nm in width of each groove, 50 nm in groove-to-groove distance and 100 nm in height was certainly formed in the region from 24 mm to 30 mm in radius from the center and that four cross marks as the center axis positioning pattern were formed in intervals of 90 degrees in rotation angle inside by 100 μm from the perimeter of an embossed structure sized 24 mm in radius.

Additionally, the top and bottom of the groove structure were confirmed to have the flatness not larger than 10 nm in the region having a width not smaller than 30 nm.

Next as shown in FIG. 9D, the magnetic layer 1302 was patterned. More specifically, using this resist pattern as a mask, the $SiO_2$ film 1314 was etched, and next using the $SiO_2$ film 1314 as a mask, the matrix 1313 was etched to form the groove structure.

Figure 11E:
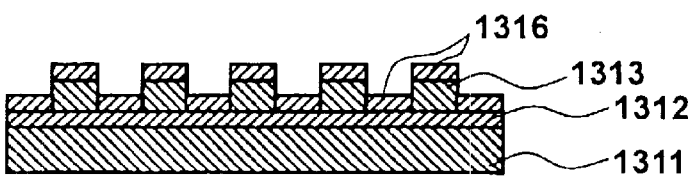

Next as shown in FIG. 11E, recording racks were formed by forming an approximately 30 nm thick indium-antimony-tellurium (In—Sb—Te) layer 1316 to cover the groove structure.

Figure 11F:
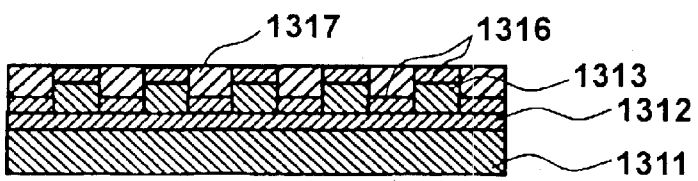

After that, as shown in FIG. 11F, a $SiO_2$ film was formed on the entire substrate surface, and its surface was smoothed to form the protective film 317.

Figure 12:
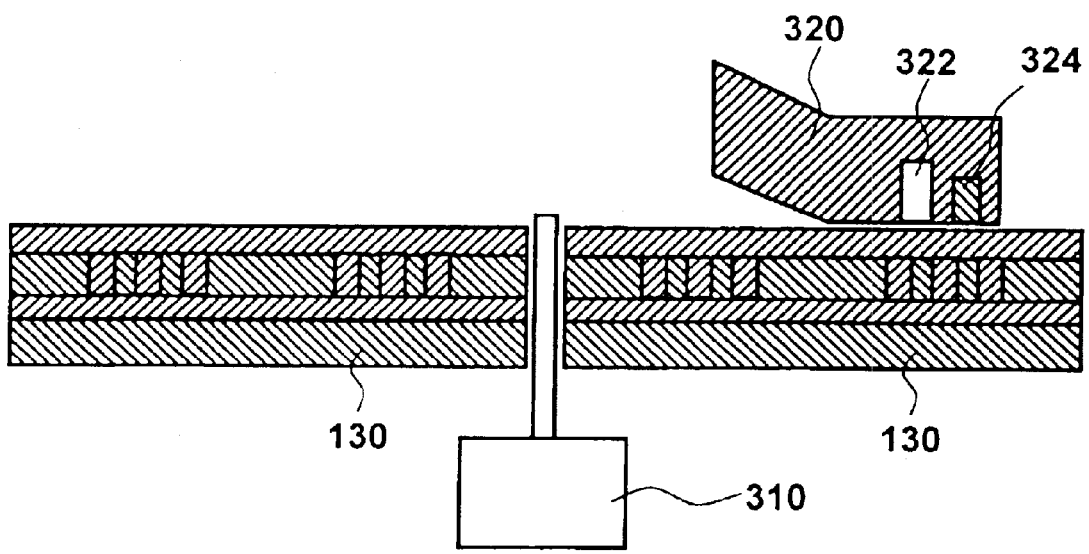
FIG. 12 is a cross-sectional view of a phase-change optical disk according to Example 2 of the invention and a head slider used for record and reproduce operation with the disk.

FIG. 12 is a cross-sectional view of a phase-change optical disk according to Example 2 of the invention and a head slider used for record and reproduce operation with the disk. The optical disk 130 can be set on the spindle motor in axial alignment within 1 μ by referring to the center axis positioning pattern simultaneously transferred in the imprinting process, and it is rotated in response to a control signal from a controller not shown. The optical disk 130 is a medium prepared according to this Example 2, and includes a recording layer 1316 having recording track band on the glass substrate and the protective film 1317.

A laser-oscillated optical recording head 322 and a surface emitting laser write head 324 are supported on the distal end of a head slider 320. The head slider 320 is set in position by a two step actuator (not shown).

Figure 13:
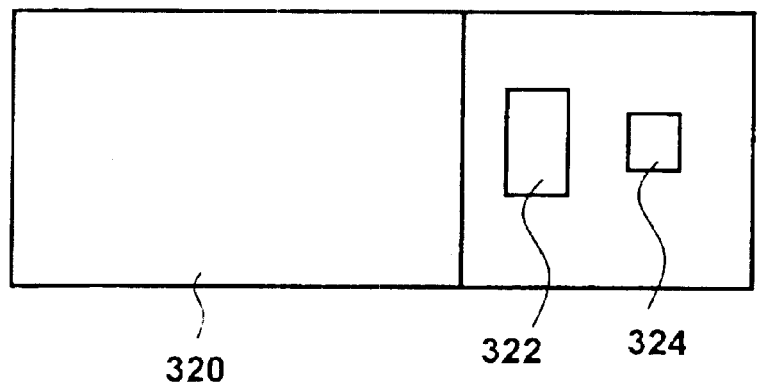
FIG. 13 is a diagram that roughly shows a surface configuration of minute apertures formed in the head slider.

FIG. 13 is a diagram that roughly shows a surface configuration of minute apertures formed in the head slider. Size of the small hole 322H formed in the read head 322 is 35 nm high and 20 nm wide whereas size of the small hole 324H of the write head 324 is 20 nm high and 20 nm wide.

According to this Example 2, it is possible to fabricate the phase-change recording medium having a 50 nm pitch pattern on the entire surface of the 2.5 inch disk substrate and to realize a phase-change optical recording system with an ultrahigh density.

Example 3

Next explained is Example 3 that is an experimentally prepared magnetic recording medium made by transferring magnetic information thereon from a master plate.

Figure 14A:
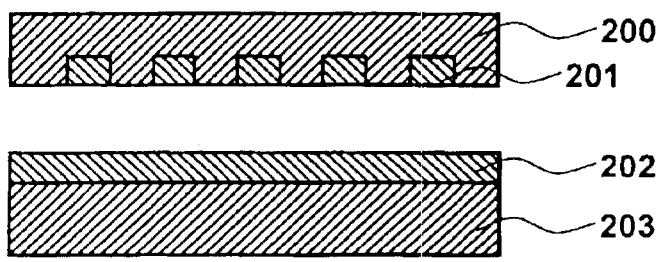
FIGS. 14A through 14C are cross-sectional views for explaining a magnetic printing method as a magnetic recording medium manufacturing method according to Example 3.
Figure 14B:
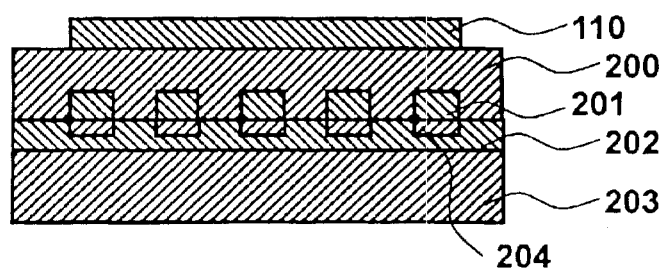
Figure 14C:
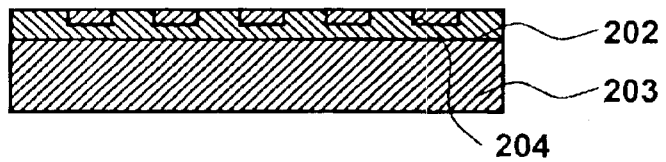

FIGS. 14A through 14C are cross-sectional views for explaining a magnetic printing method as a magnetic recording medium manufacturing method according to Example 3.

First as shown in FIG. 14A, a master disk 200 and a slave disk 203 are prepared. The master disk is a substrate sized 65 mm in diameter, which holds a magnetic signal 201 in a region from 24 mm to 30 mm in radius on the top surface thereof. The slave disk 203 is a disk substrate sized 65 mm in diameter, which has a magnetic layer 202 on its surface.

Using this master disk 200, magnetic printing was carried out in the same manner as Example 1. As a result, magnetic signal 201 was transferred from the master disk 200 to the magnetic layer 202 on the top surface of the slave disk 203.

That is, as shown in FIG. 14B, the master disk 200 and the slave disk 203 are closely opposed to each other in the atmosphere, and a PET sheet sized 31 mm in outer diameter and 1 mm in thickness was prepared. Then these elements were placed in a press machine as follows.

(Upper press surface 100)
(Buffer layer 110)
(Master disk 200)
(Slave disk 203)
(Lower press surface 100)

In the magnetic printing process, a bias magnetic field was applied for 10 seconds from outside under the pressure of 1000 bar in the atmosphere.

Through these steps, the magnetic signal was transferred from the top surface of the master disk 200 to the magnetic layer 202 on the slave disk 203 The top surface of the slave disk 203 after transfer of the magnetic signal was observed by MFM (magnetic force microscope), and it was confirmed that magnetic information 204 corresponding to the magnetic signal 201 on the master disk 200 was certainly formed uniformly over the entire surface of the slave disk 203.

Example 4

As Example 4 of the present invention, next explained is a specific example of the drum-type magnetic recording medium as according to the embodiment already explained with reference to FIGS. 5 to 8.

First, a magnetic layer was formed on the surface of a glass cylinder sized 1 inch in diameter and 1 inch in height by depositing the palladium (Pd) base layer, approximately 30 nm thick, and approximately 50 nm thick cobalt chromium platinum (CoCrPt) as a vertically magnetized recording material in the same configuration as the first embodiment. Additionally, an approximately 50 nm $SiO_2$ film was deposited on the magnetic layer. Then a resist was coated on the $SiO_2$ film by dipping to obtain the donee member 530.

Next as shown in FIG. 4, while the donee member is rolled over the master plate 520 under a pressure, the pattern was transferred from the master plate to the top surface of the donee member 530 by the imprinting technique.

The master plate 520 was prepared in the manner explained below. Three rectangular pattern-forming regions (corresponding to 520A) each sized 0.2 inches horizontally and three inches vertically are formed as shown in FIG. 6 by using electron beam lithography. A groove or indention structure sized 100 nm in width of each groove, 100 nm in groove-to-groove distance and 100 nm in height was formed in each pattern-forming region. Further, in the blank region (corresponding to 520B) near corners of pattern-forming regions at opposite sides, two cross marks were formed at positions 100 μm distant from the perimeter of the pattern-forming region 520A to use them as the positioning pattern (corresponding to 520C).

On the top surface of the glass master plate, a 300 μm thick nickel film was formed by plating. Then the nickel film was separated and cut away from the glass master plate. Thus the nickel master plate was obtained, which has the outer dimension on inch high, 3.1 inches wide and 300 μm thick, and includes the groove structure with straight grooves sized 100 nm in width of each groove, 100 nm in groove-to-groove distance and 100 nm in height in the pattern-forming region 520A, and two cross marks as the positioning pattern 520C.

The nano-imprinting was carried out in the following manner, using the configuration exemplified in FIG. 5.

Three PET sheets each being 0.2 inches wide, 3 inches long and 1 mm thick were prepared as the buffer layer 510. Then the respective elements were place in a press machine as follows.

(Glass cylinder with the magnetic film and the resist film) 530

(Master plate) 520

(Buffer layer) 510

(Press surface) 500

Each of these three buffer layers 510 are placed to overlap three pattern carrier regions 520A formed on the master plate 520.

In the press process, the imprintinging was carried out by pressing the glass cylinder 530 against the master plate with the pressure of 1000 bar in the atmospheric air, and rolling the glass cylinder 530 over the master place 520 at the angular velocity of 30 degrees per second such that all pattern carrier regions 520A on the master plate 520 were transferred to the surface of the glass cylinder 530.

After the press process, the donee member 530 was separated from the master plate 520.

Through these steps, the embossed patterns were transferred from the master plate 520 to the surface of the resist film on the glass cylinder 530. The surface of the glass cylinder 530 after the imprinting process was observed by AFM (atomic force microscopy), and it was confirmed that the groove structure with straight grooves sized 100 nm in width of each groove, 100 nm in groove-to-groove distance and 100 nm in height in the pattern-forming region 530A had been formed on the side surface of the cylinder and that twp cross marks had been formed simultaneously as the positioning pattern at positions 100 μm distant from the perimeter of the pattern-forming region 530A.

After that, the magnetic layer on the surface of the cylinder was patterned. More specifically, using the resist mask having the transferred embossed pattern as a mask, the $SiO_2$ film was etched by RIE (reactive ion etching) to the level of the top surface of the magnetic layer to transfer the pattern to the $SiO_2$ film accordingly, and next using this pattern, the magnetic layer was etched. The groove regions thus obtained serve as isolating region. The patterned magnetic layer forms the recording track band.

Subsequently, an approximately 50 nm thick $SiO_2$ film was formed on the entire substrate surface to bury the grooves and obtain the isolation region.

Thereafter, the top surface of the $SiO_2$ film was polished and smoothed by chemical mechanical polishing (CMP). Additionally, by forming a film of diamond-like carbon as the protective film 1306 on the entire surface, the drum-type magnetic recording medium 530 was obtained.

The drum-type magnetic recording disk medium 530 obtained in this manner was set on a spindle motor. Additionally, as shown in FIG. 8, the linear drive shaft 630 was placed beside the recording medium 530 in parallel to the center axis of the recording medium 530, the linear driver 640 was affixed to the drive shaft 630, and the record/reproduce head 620 was mounted on the linear driver 640 so as to bring the record/reproduce head 620 into contact with the recording region on the surface of the magnetic recording medium 530.

Further, using the positioning pattern 530C simultaneously transferred in the imprinting process, a servo pattern was made with the record/reproduce head 620, and through further manufacturing steps disclosed in Japanese Patent Publication No. hei 1-42051, the drum-type magnetic recording medium was completed.

According to this Example, the magnetic recording layer having the 100 nm pitch pattern over the entire area of the recording region 530A of the drum-type recording medium 530 could be fabricated reliably and easily, and an ultrahigh density magnetic recording system could be realized.

Heretofore, some embodiments of the invention have been explained with reference some specific examples. However, these specific examples should never be construed to restrict the scope of the invention.

For example, with regard to the structure, material, size and others of the substrate used as the donee substrate in embodiments of the invention, the invention involves in its scope other alternatives that persons skilled in the art will be able to choose to use the invention and obtain equivalent effects.

More specifically, a plastic deformable material may be used in lieu of the resist on the top surface of the donee substrate. Alternatively, the entirety of the donee substrate may be made of such a material. Usable materials of this type include various kinds of organic materials, inorganic materials, metals, semiconductor materials or their complexes.

Similarly, the invention also involves in its scope all nano-imprinting methods persons skilled in the art can use by appropriate design changes from the nano-imprinting methods explained herein as embodiments of the invention.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A nano-imprinting method for transferring an embossed pattern from a master plate having the embossed pattern to a pattern-receiving surface of a pattern-receiving element, comprising:

preparing the master plate having an information carrier region on which the embossed pattern is formed, and a substantially flat information-free region;

preparing the pattern-receiving element having the pattern-receiving surface which has a size corresponding to the information carrier region plus at least a part of the information-free region;

preparing a buffer layer which is smaller than the master plate and the pattern-receiving surface and has a shape corresponding to the information carrier region; and applying a pressure to the master plate and the pattern-receiving element by a pair of press surfaces holding the master plate, the pattern-receiving element and the buffer layer.

2. A nano-imprinting method according to claim 1, wherein the buffer layer is interposed in a position aligned with the information carrier region between the master plate and the pair of press surfaces when the pressure is applied to the master plate by the pair of press surfaces.

3. A nano-imprinting method according to claim 1, wherein the buffer layer is interposed in a position aligned with the information carrier region between the pattern-receiving element and the pair of press surfaces when the pressure is applied to the pattern-receiving element by the pair of press surfaces.

4. A nano-imprinting method according to claim 1, wherein the buffer layer is made of a material softer than materials of the pair of press surfaces and the master plate.

5. A nano-imprinting method according to claim 1, wherein the buffer layer is larger than the information carrier region of the master plate and does not exceed the region outside the information carrier region by 3 mm.

6. A nano-imprinting method according to claim 1, wherein the pressure applied for transferring the pattern is not lower than 500 bar in the atmospheric air.

7. A nano-imprinting method according to claim 1, wherein the pattern-receiving element has a pattern-receiving layer on the pattern-receiving surface, and the pressure is applied for transferring the pattern at a temperature lower than a glass transition temperature of the pattern-receiving layer.

8. A nano-imprinting method for transferring an embossed pattern from a master plate having the embossed pattern to a pattern-receiving surface of a pattern-receiving element in form of a substantially cylindrical drum having the pattern-receiving surface on a side surface thereof, comprising:

preparing the master plate having an information carrier region on which the embossed pattern is formed, and a substantially flat information-free region;

preparing the pattern-receiving element having the pattern-receiving surface which has a size corresponding to the information carrier region plus at least a part of the information-free region;

preparing a buffer layer which is smaller than the master plate and the pattern-receiving surface and has a shape corresponding to the information carrier region; and pressing and rolling the pattern-receiving element over the master plate which is placed on a press surface via the buffer layer.

9. A nano-imprinting method according to claim 8, wherein the buffer layer is made of a material softer than materials of the press surface and the master plate.

* * * * *